(12) United States Patent
Heid

(10) Patent No.: US 6,400,153 B1
(45) Date of Patent: Jun. 4, 2002

(54) METHOD FOR RECONSTRUCTING AN IMAGE OF A SUBJECT FROM IMAGE DATA OBTAINED BY MAGNETIC RESONANCE

(75) Inventor: Oliver Heid, Gunzenhausen (AT)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/543,849

(22) Filed: Apr. 5, 2000

(30) Foreign Application Priority Data

Apr. 6, 1999 (DE) .......................................... 199 15 362
Mar. 2, 2000 (DE) .......................................... 100 10 017

(51) Int. Cl.[7] ................................................ G01V 3/00
(52) U.S. Cl. ...................... 324/312; 324/318; 324/307; 324/309
(58) Field of Search ................................ 324/312, 318, 324/307, 309

(56) References Cited

U.S. PATENT DOCUMENTS 5,759,152 A * 6/1998 Felmlee et al. ............. 324/309
6,043,651 A    3/2000 Heid

OTHER PUBLICATIONS

"Phase Alignment of Multiple Surface Coil Data for Reduced Bandwidth and Reconstruction Requirements," Debbins et al., Mag. Res. Med., vol. 38, pp. 1003–1011 (1997).

* cited by examiner

*Primary Examiner*—Edward Lefkowitz
*Assistant Examiner*—Dixomare Vargas
(74) *Attorney, Agent, or Firm*—Schiff Hardin & Waite

(57) ABSTRACT

Respective MR signals from a subject are received by at leasttwo MR antennas. The received MR signals have a phase angle relative to one another. The phase relations are determined from a correlation of the received MR signals. The MR signals are added as phase-corrected signals to form a sum signal. The sum signal is then used for further image reconstruction of the subject.

10 Claims, 3 Drawing Sheets

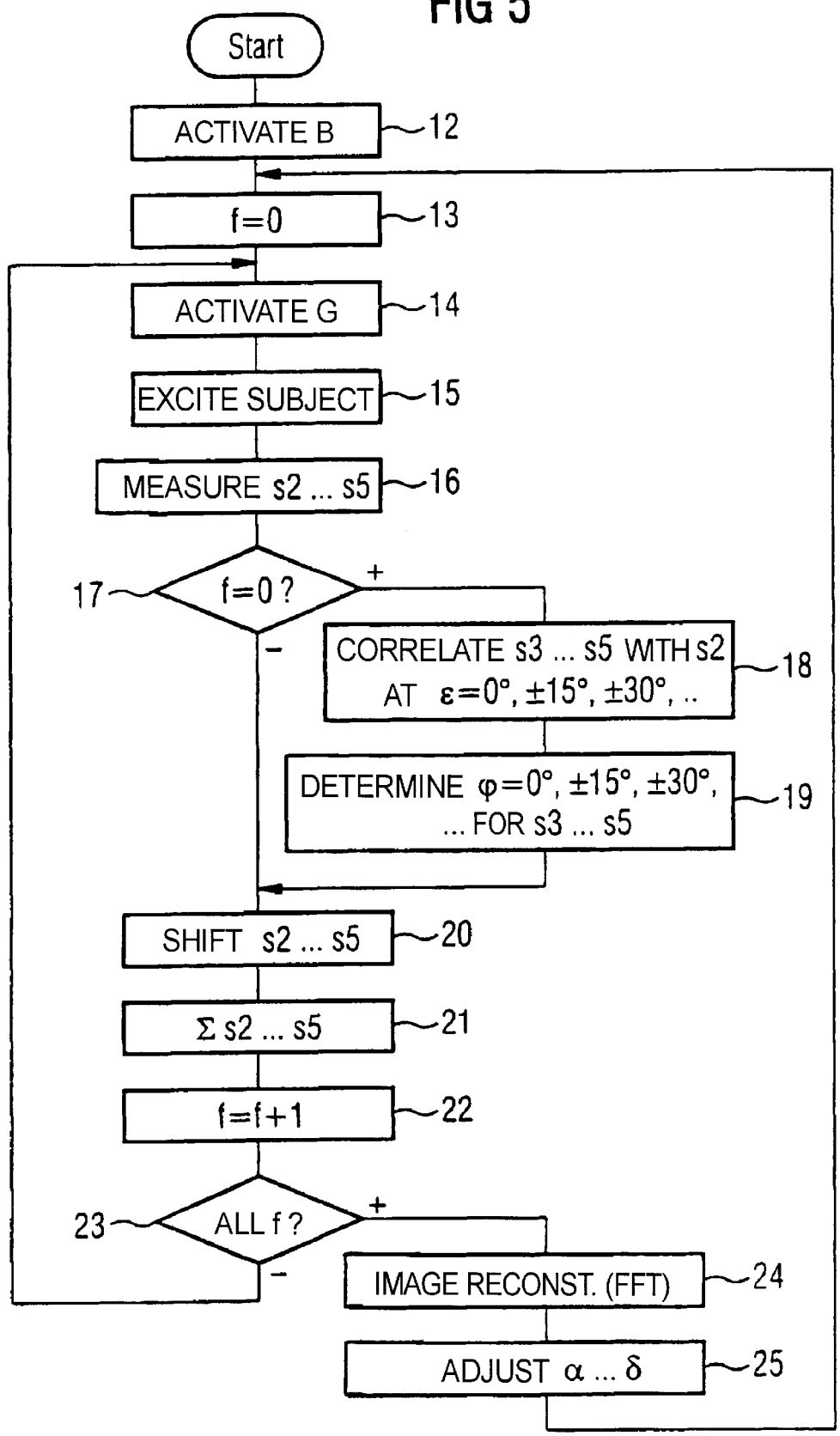

METHOD FOR RECONSTRUCTING AN IMAGE OF A SUBJECT FROM IMAGE DATA OBTAINED BY MAGNETIC RESONANCE

BACKGROUND OF THE INVENTION

1. Field of the Invention

The present invention relates to a method for reconstructing an image subject from image data obtained by magnetic resonance.

2. Description of the Prior Art

An image reconstruction method is known from "Phase Alignment of Multiple Surface Coil Data for Reduced Bandwidth and Reconstruction Requirements," published in Magnetic Resonance in Medicine, vol. 38 (1997): 1003–1011, wherein a subject is excited to a state of magnetic resonance in gradient fields of different spatially encoded frequencies in succession, and for each frequency an MR signal of the subject is received by at least two MR antennas, the totality of the received MR signals forming an MR spectrum, from which an image of the subject is reconstructed, and wherein the MR signals received by one of the MR antennas has a phase angle relative to the MR signals received by the other MR antenna, and wherein this phase relation is determined by a computing unit, and for each frequency the MR signals of the two MR antennas are added as phase-corrected signals to form a sum signal, and this sum signal is used in the further reconstruction of the image of the subject.

This known image reconstruction method already functions rather well. In particular, it has a good signal-to-noise ratio and requires only one Fourier transform for the image reconstruction. In this known method, the phase relation is determined using a preliminary scan. Later modifications are no longer possible, or are possible only with degradation of the signal-to-noise ratio.

SUMMARY OF THE INVENTION

An object of the present invention is to further develop the known image reconstruction method such that the current phase relation of the MR signals to one another can be determined at any time.

The object is achieved in accordance with the invention in an image reconstruction method of the type described above, wherein the phase relation is determined bythe computing unit automatically from a correlation of the MR signals that are received by the MR antenna.

It is possible in this way to readjust the MR antennas at any time. In particular, the possibility is created to adjust the geometric position of the MR antennas even during the examination of a subject. It is thus possible to pick up at least one first MR spectrum and one second MR spectrum in succession, at least one of the MR antennas being arranged differently in relation to the subject during the reception of the second MR spectrum than during the reception of the first MR spectrum.

When the received MR signals are digitized, and the phase correction of the MR signals is performed subsequent to the digitizing of the MR signals received by the MR antennas, the phase correction of the MR signals is particularly simple to accomplish. It is not necessary to execute the correlation process, owing to simultaneously received MR signals. The MR signals also can be received by the antennas with a short time separation.

Alternatively, the phase correction can also be preformed priorto the digitization of the MR signals.

The phase correction is even simpler (particularly when it precedes the digitization process) when at least one of the MR signals is shifted in relation to another of the MR signals by a whole-number multiple of a step angle, so that the phase relation of the shifted MR signal to the other MR signal is as at most half the step angle. The step angle can be between 10° and 20°, for instance 15°.

The determination of the correlation is also sufficiently precise when it is performed in correlation steps with a stepwidth between 10° and 20°, for example.

DESCRIPTION OF THE DRAWINGS

FIG. 5 is a flow chart illustrating the inventive method for image reconstruction.

DESCRIPTION OF THE PREFERRED EMBODIMENTS

Figure 1:
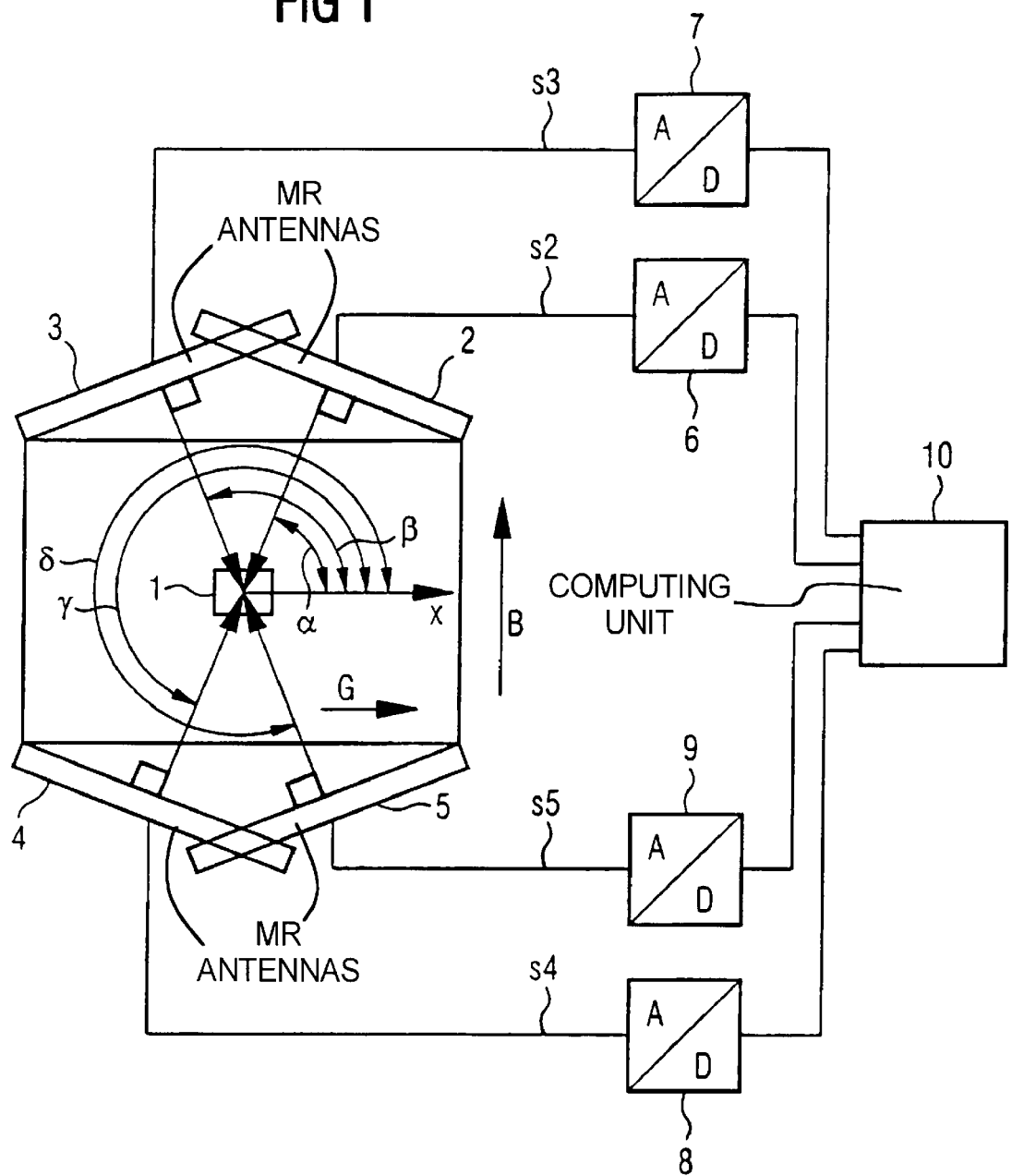
FIG. 1 is a schematic block diagram of a magnetic resonance imaging apparatus constructed and operating in accordance with the principles of the present invention.

As shown in FIG. 1, a subject 1 is exposed to a magnetic field B, which is superimposed with a gradient field G. The subject 1 is magnetically polarized by the gradient field B and spatially-coded by the gradient field G. Furthermore, the subject 1 is excited in a conventional manner to a state of magnetic resonance by transmitting antenna elements, which are not illustrated.

Four MR antennas 2 to 5 are arranged around the subject 1. Each of these receives one MR signal s2 to s5. The MR signals s2 to s5 are fed to respective analog/digital converters 6 to 9, are digitized therein, and are then fed to a computing unit 10. In the computing unit 10, the digitized MR signals s2 to s5 are processed by software.

Figure 2:
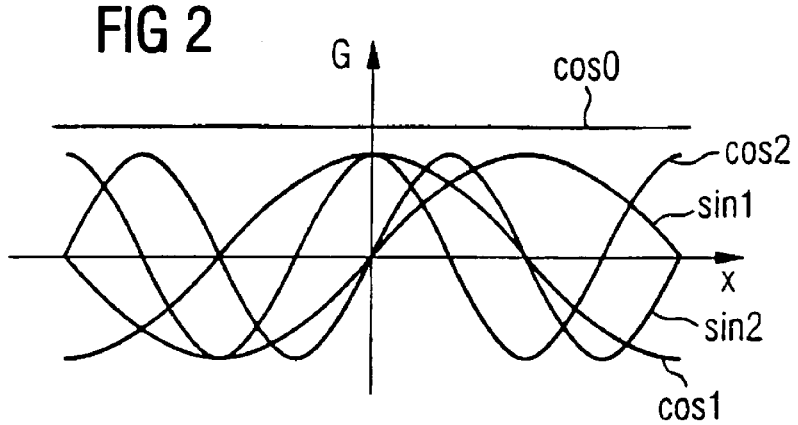
FIG. 2 shows various field gradient characteristics which arise in the operation of the magnetic resonance imaging apparatus of FIG. 1.

As shown in FIG. 2, the gradient field G can have different spacial frequencies. A d.c. magnetic field cos0 and a sine and a cosine fundamental oscillation sin1, cos1 as well as the first harmonic oscillations sin2, cos2, are represented in FIG. 2 as examples. Typically, many harmonic oscillations sinN, cosN are generated in succession. One frequency of the subject 1 is measured using each gradient field G. The image of the subject 1 thus can be reconstructed better as more harmonic oscillations sinN, cosN are generated.

The subject 1 is exposed to the different gradient fields G in succession. For each gradient field G, i.e. for each spacial frequency cos0, sin1, cos1, . . . , sinN, cosN, each MR antenna 2 to 5 picks up a respective MR signal s2 to s5. The MR signals s2 to s5 are stored in the computing unit 10.

Figure 3:
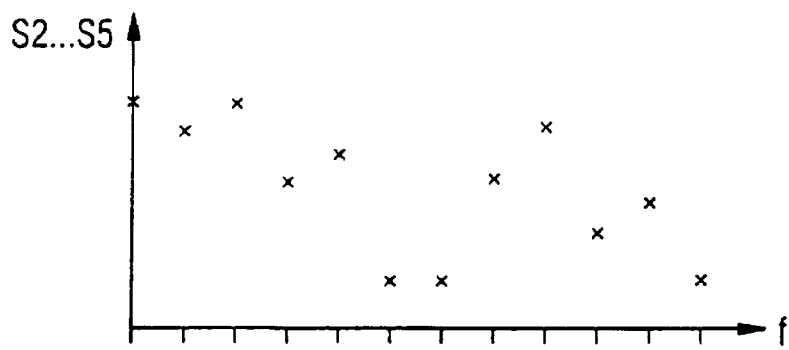
FIG. 3 shows a magnetic resonance spectrum obtained using the imaging apparatus of FIG. 1.

The totality of the received MR signals s2 to s5 represents a Fourier MR spectrum of the subject 1. An example of such an MR spectrum is represented in FIG. 3. An image of the subject 1 can this be reconstructed by a Fourier transform, preferably a fast Fourier transform.

According to FIG. 1, the MR antennas 2 to 5 are arranged around the subject 1 at reception angles α, β, γ and δ. Owing to the different reception angles α to δ and possibly to other factors, such as different signal transit times, the MR signals s2 to s5 have different phase relations to one another. As a consequence, the MR signals s2 to s5 cannot simply be added. In the extreme case, simple addition could even result in destructive interference in the signal. Therefore, the phase relations of the MR signals s3 to s5 relative to the MR signal s2 are determined in the computing unit 10, and the MR signals s2 to s5 are then added in phase-corrected form to produce a sum signal. The MR signals s2 to s5 are evaluated by the computing unit 10 automatically; that is, the phase relations are automatically computed and corrected. The MR signal s2 serves as a reference signal. The determined phase relations are specified to the phase shifters 11 by the computing unit 10 in conjugated form.

The phase relation of the MR signals s3 to s5 relative to the MR signal s2 is equal for all spatial frequencies. Therefore, it need only be determined once. As soon as the phase relations are determined, the MR signals s2 to s5 for each frequency f can be added to from the sum signal S in a running manner. From the spectrum of the sum signal S, the image of the subject 1 is then reconstructed. In the image reconstruction, it is only necessary to use a single sum data record, rather than four data records.

Figure 4:
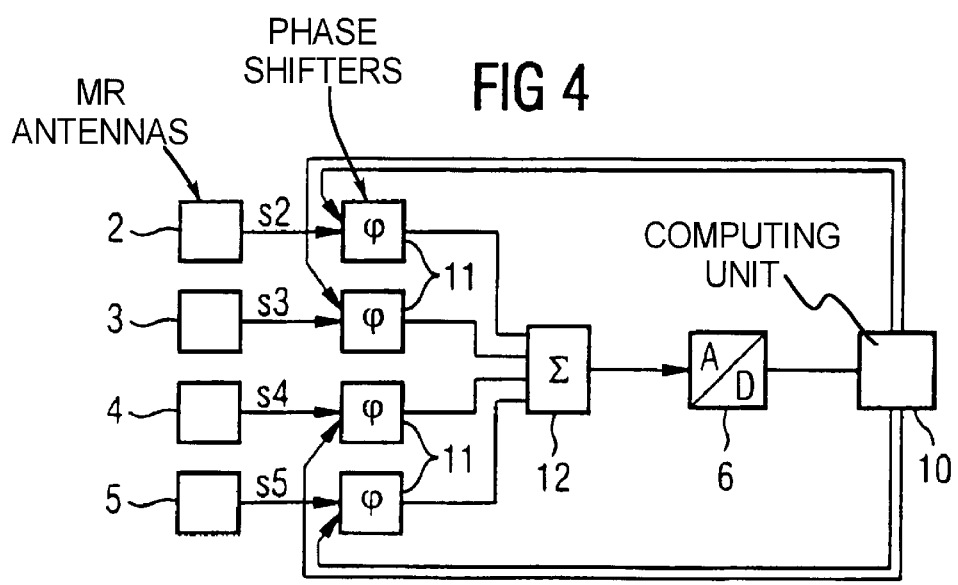
FIG. 4 is a block diagram showing a further version of a magnetic resonance apparatus constructed and operating in accordance with the principles of the present invention.

Alternatively to the arrangement according to FIG. 1, in the embodiment of FIG. 4 the analog MR signals s3 to s5 can be fed to phase shifters 11 that can be adjusted in increments. The phase shifters 1 shift the MR signals s3 to s5 by a step angle $\phi$ from 10° to 20° per increment; for instance, by 15°. The phase shifters 11 are set such that, subsequent to the shifting of the phase relations, the phase angles of the MR signals s3 to s5 in relation to the reference signal s2 are at most half the step angle $\phi$. The MR signals s3 to s5 are thus phase-corrected relative to the MR signal s2 only up to a residual phase. This can be tolerated, however, since the signal reduction exerts its influence only with the cosine of the residual phase. The sum signal is digitized only after the summation in an adder 12.

In the gradient field G, the subject 1 generates MR signals s2 to s5 due to the excitation via the transmitting elements, which signals have a matching base frequency. The signal curve is also the same for all MR signals s2 to s5. The phase relation thus can be determined in a manner that is known per se by a simple correlation of the MR signals s2 to s5 to one another. Methods for determining the correlation between two signals are described in "Digitale Verarbeitung analoger Signale" (S. D. Stearn, Oldenbourg, Munich, 1979:297–299).

In principle, the correlation of the MR signals s2 to s5 to one another can be performed at every frequency f, but the correlation of the MR signals s2 to s5 can be determined most reliably when MR signals s2 to s5 in which the gradient field G has a low frequency f are correlated with one another. The correlation is thus preferably determined using the MR signals s2 to s5 during which the gradient field G is the d.c. magnetic field cos0 or the magnetic field of a fundamental oscillation sin1, cos1, possibly even of the first harmonic oscillation sin2, cos2. Higher harmonic oscillations also can be applied for determining the correlation, and thus the phase relation, of the MR signals s2 to s5. The correlation can also be determined in correlation steps having a relatively large stepwidth e of e.g. 10° to 20°.

FIG. 5 illustrates a procedure for the correlation of the MR signals s2 to s5 that were generated during the d.c. magnetic field cosO. FIG. 5 also shows that two MR spectrums are picked up in succession, and that between the pick-ups of the MR spectrums the arrangement of the MR antennas 2 to 5 with respect to the subject 1 is changed.

According to FIG. 5, the basic magnetic field B is activated in a step 12. Then the frequency f of the gradient field G is set to zero in step 13 and the gradient field G is activated in a step 14.

In the next step, step 15, the subject 1 is excited to a state of magnetic resonance, and in a step 16 the MR signals s2 to s5 are measured. Then, in a step 17, it is interrogated whether the frequency f is zero, i.e. if the d.c. magnetic field cos0 is present.

If so, in a step 18 correlations of the MR signals s3 to s5 are determined using the stepwidth $\epsilon=15°$. Then in a step 19 the phase relations of the MR signals s2 to s5 are determined. Then in a step 20 the phase relations are corrected, and in a step 21, the MR signals s2 to s5 are added into a sum signal S.

In a step 22, the frequency f is then incremented. In the subsequent step 23, it is interrogated whether all frequencies have been gone through; that is, if the spectrum has been picked up completely. If not, the procedure returns to step 14.

When all frequencies f have been used—that is, a measurement of the MR signals s2 to s5 has been accomplished at every spatial frequency f—the procedure skips to step 24, in which an image reconstruction is performed with the aid of a fast Fourier transform. In a subsequent step 25, the angles $\alpha$-$\delta$ can be readjusted and the procedure can return to step 13 again.

Alternatively, before and/or during the actual measurement of the MR signals s2 to s5, additional measurement data can be acquired, which are then used to estimate the phase relations of the MR antennas 3 to 5 relative to the MR antenna 2. In this case, the MR signals s2-s5 from which the phase relation is determined are different from the MR signals s2-s5 which are used for the reconstruction of the image of the subject 1. The measurement data can be acquired sequentially. In this way, parallel reception channels can be avoided. Using the phase relations so determined, the phase shifter 11 can be adjusted.

Although modifications and changes may be suggested by those skilled in the art, it is the intention of the inventor to embody within the patent warranted hereon all changes and modifications as reasonably and properly come within the scope of his contribution to the art.

What is claimed is:

1. A method of reconstructing an image of a subject using data obtained by magnetic resonance, comprising the steps of:

successively exposing a subject to magnetic gradient fields having respectively different spatial frequencies while said examination subject is also in a basic magnetic field and exciting nuclear spins in said examination subject and subsequently, for each spatial frequency, receiving a magnetic resonance signal from said subject with at least two antennas, a totality of all of said magnetic resonance signals forming a magnetic resonance spectrum, and for each spatial frequency the magnetic resonance signal received by one of said antennas having a phase angle relative to the magnetic resonance signal received by the other antenna;

determining a phase relation between the magnetic resonance signal for each spatial frequency In a computing unit automatically without human intervention by correlating the magnetic resonance signals respectively received by said at least two antennas;

adding the magnetic resonance signals received by the at least two antennas as phase-corrected signals to form a sum signal; and reconstructing an image of said subject using said sum signal.

2. A method as claimed in claim 1 wherein said magnetic resonance spectrum is a first magnetic resonance spectrum, and comprising the additional steps of subsequently exciting said subject to obtain a second magnetic resonance spectrum with at least one of said antennas being differently arranged for obtaining said second magnetic resonance spectrum relative to obtaining said first magnetic resonance spectrum, and wherein the step of reconstructing said image of said subject comprises reconstructing said image of said subject using said first magnetic resonance spectrum and said second magnetic resonance spectrum.

3. A method as claimed in claim 1 comprising obtaining signals from said subject during application of a gradient field which is a spacial d.c. magnetic field and determining said phase-relation using said signals obtained when said gradient field is a spacial d.c. magnetic field.

4. A method as claimed in claim 1 comprising obtaining signals from said subject during application of a gradient field which is a magnetic field with a low spacial frequency and determining said phase-relation using said signals obtained when said gradient field is a magnetic field with a low frequency.

5. A method as claimed in claim 1 comprising digitizing said magnetic resonance signals, and phase correcting said magnetic resonance signals after digitization thereof.

6. A method as claimed in claim 1 comprising digitizing said magnetic resonance signals, and phase correcting said magnetic resonance signals before digitization thereof.

7. A method as claimed in claim 1 comprising, for each spatial frequency, shifting at least one of the magnetic resonance signals relative to another of the magnetic resonance signals by a whole-number multiple of a step angle, so that the phase angle of the shifted magnetic resonance signal relative to the other magnetic resonance signal is at most as large as one-half of said step angle.

8. A method as claimed in claim 6 comprising using a step angle between 10° and 20°.

9. A method as claimed in claim 1 wherein the step of correlating said magnetic resonance signals comprises correlating said magnetic resonance signals in increments with a stepwidth.

10. A method as claimed in claim 9 comprising using a stepwidth between 10° and 20°.

* * * * *